US009519009B2

(12) United States Patent
Murakami et al.

(10) Patent No.: US 9,519,009 B2
(45) Date of Patent: Dec. 13, 2016

(54) PROBER

(71) Applicant: Tokyo Seimitsu Co., Ltd., Hachioji-shi, Tokyo (JP)

(72) Inventors: Konosuke Murakami, Tokyo (JP); Toshiro Mori, Tokyo (JP); Yuji Shigesawa, Tokyo (JP); Kazuhisa Aoki, Tokyo (JP); Akira Yamaguchi, Tokyo (JP)

(73) Assignee: Tokyo Seimitsu Co., Ltd., Hachioji-Shi, Tokyo (JP)

( * ) Notice: Subject to any disclaimer, the term of this patent is extended or adjusted under 35 U.S.C. 154(b) by 238 days.

(21) Appl. No.: 14/548,487

(22) Filed: Nov. 20, 2014

(65) Prior Publication Data
US 2015/0137842 A1 May 21, 2015

(30) Foreign Application Priority Data

Nov. 21, 2013 (JP) ................. 2013-240885

(51) Int. Cl.
*G01R 31/00* (2006.01)
*G01R 1/04* (2006.01)
(Continued)

(52) U.S. Cl.
CPC .............. *G01R 1/0491* (2013.01); *G01R 1/067* (2013.01); *G01R 1/06777* (2013.01);
(Continued)

(58) Field of Classification Search
CPC ... G01R 1/0408; G01R 1/0433; G01R 1/0483; G01R 1/07314; G01R 31/26; G01R 31/2808; G01R 31/2886
See application file for complete search history.

(56) References Cited

U.S. PATENT DOCUMENTS 4,934,064 A * 6/1990 Yamaguchi ........ G01R 1/07314
324/750.19
5,642,056 A * 6/1997 Nakajima .......... G01R 1/06705
324/750.22
(Continued)

FOREIGN PATENT DOCUMENTS

| JP | 2011-138865 A | 7/2011 |
| JP | 2013-118320 A | 6/2013 |
| WO | 2011/111834 A1 | 9/2011 |

OTHER PUBLICATIONS

Dec. 4, 2013—(JP) Notification of Reasons for Rejection—App 2012-265206.
(Continued)

*Primary Examiner* — Tung X Nguyen
(74) *Attorney, Agent, or Firm* — Banner & Witcoff, Ltd.

(57) ABSTRACT

A prober includes: a wafer chuck having a conductive support surface; a movement rotation mechanism which moves and rotates the wafer chuck; a head stage which holds a probe holding portion; a stage member which has a conductive stage surface that is formed in parallel to the support surface and electrically connected with the support surface, and can move integrally with the wafer chuck; and a contactor which is fixed to a position facing the stage member and whose tip can electrically come into contact with the stage surface, wherein the stage member is separated from the wafer chuck as a separate body, and the stage surface and the support surface are electrically connected through a wiring member; and a back-surface electrode of a chip is electrically connected with a tester through the wafer chuck, a wiring, the stage member and the contactor.

8 Claims, 6 Drawing Sheets

(51) Int. Cl.
    *H01L 21/683*   (2006.01)
    *G01R 31/26*    (2014.01)
    *G01R 31/28*    (2006.01)
    *G01R 1/067*    (2006.01)
(52) U.S. Cl.
    CPC ..... *G01R 31/2601* (2013.01); *G01R 31/2608* (2013.01); *G01R 31/2874* (2013.01); *H01L 21/6831* (2013.01); *H01L 21/6833* (2013.01)

(56) References Cited

U.S. PATENT DOCUMENTS

| | | |
|---|---|---|
| 6,130,543 A | 10/2000 | Iino |
| 2004/0183546 A1 | 9/2004 | Watanabe |
| 2013/0063171 A1 | 3/2013 | Kouno et al. |
| 2013/0141127 A1 | 6/2013 | Yasuta et al. |
| 2013/0141132 A1 | 6/2013 | Yasuta et al. |

OTHER PUBLICATIONS

Apr. 17, 2015—(EP) Extended European Search Report—App 14193778.9.

* cited by examiner

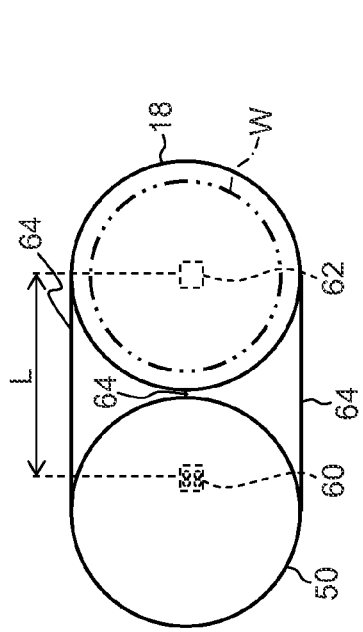
FIG.3A
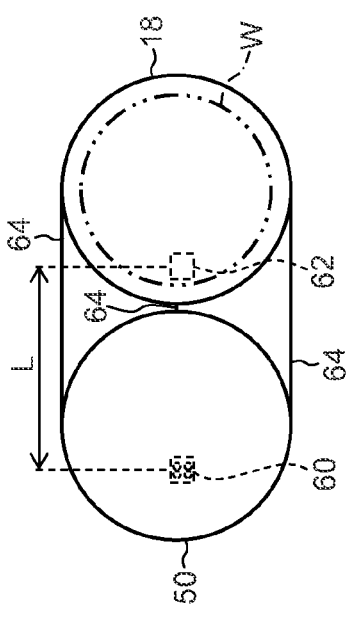
FIG.3B
FIG.3C
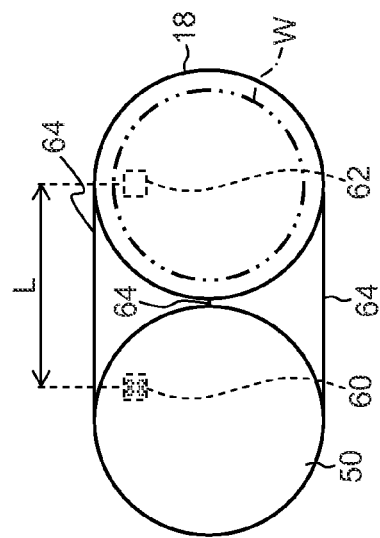
FIG.3D
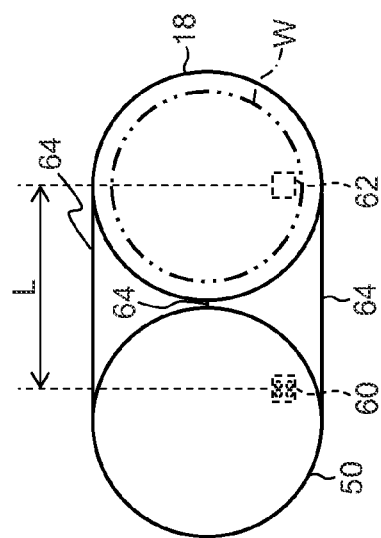
FIG.3E

PROBER

BACKGROUND OF THE INVENTION

1. Field of the Invention

The present invention relates to a prober that performs an electrical inspection of multiple chips formed on a semiconductor wafer.

2. Description of the Related Art

In a semiconductor manufacturing process, various kinds of processing are applied to a thin disc-like semiconductor wafer, and multiple chips (dies) each having a semiconductor apparatus (device) are formed. The electrical characteristic of each chip is inspected, and then, after each chip is subsequently separated by a dicer, it is fixed to a lead frame or the like and assembled. The above-mentioned electrical characteristic inspection is performed by a wafer test system composed of a prober and a tester. The prober fixes a wafer to a wafer chuck and a probe is brought into contact with an electrode of each chip. For electrical inspection, the tester is electrically connected with the probe, applies current and voltage to each chip and measures the characteristic.

In semiconductor apparatuses (devices) such as a power transistor, a power MOSFET (field effect transistor), an IGBT (Insulated Gate Bipolar Transistor), LED and a semiconductor laser, an electrode (chip front-surface electrode) is generally formed on the front surface of the wafer and also an electrode (chip back-surface electrode) is formed on the back surface of the wafer. For example, in the IGBT, a gate electrode and an emitter electrode are formed on the front surface of the wafer, and a collector electrode is formed on the back surface of the wafer.

In order to conduct wafer level inspection in the above-described wafer in which multiple chips having electrodes on both wafer surfaces are formed, a wafer chuck is provided with a conductive support surface (wafer placement surface) that holds the back surface of the wafer in a state contacting with the back surface and operates as a measurement electrode of the tester. This support surface is electrically connected with the tester through a cable drawn out from the wafer chuck. Further, in a case where inspection is conducted, various kinds of measurement are performed in a state where the wafer is held in the wafer chuck and the probe is brought into contact with the electrode (chip front-surface electrode) of each chip formed on the front surface of the wafer.

However, since a cable that connect between the wafer chuck and the tester is arranged through connection connectors installed in the side surface or back surface or the like of a chassis forming the prober in a state where the cable is drawn inside/outside of the chassis, the cable normally needs to have a length of about 1 to 3 meters. Therefore, since the electrical path formed between the chip back-surface electrode and the tester becomes long to make the resistance and inductance large, there is a problem that a measurement error in high-frequency measurement or dynamic measurement is caused and the wafer level inspection cannot be properly performed at requested accuracy.

As a technique to solve such a problem, for example, Japanese Patent Application Laid-Open No. 2011-138865 discloses a technique that intends the shortening of an electrical path between a chip back-surface electrode and a tester by installing a pogo pin electrically connected with the upper surface of a wafer chuck (chuck stage) in the periphery of the wafer chuck and bringing the pogo pin into contact with a chuck lead board installed in the position facing the upper surface of the wafer chuck.

However, in the technique disclosed in Japanese Patent Application Laid-Open No. 2011-138865, since the pogo pin is fixed to the periphery of the wafer chuck, the length of the electrical path between the chip back-surface electrode and the tester varies depending on the position of a chip to be inspected on the wafer. For example, the length of the above-mentioned electrical path varies between a case where a chip existing in the vicinity of the center of the wafer is inspected and a case where a chip existing in the vicinity of the edge part of the wafer is inspected. Therefore, there is a problem that the resistance and impedance caused in the above-mentioned electrical path vary according to the position of the chip to be inspected on the wafer to adversely affect the high-frequency measurement and the dynamic measurement, and the wafer level inspection cannot be conducted at high accuracy.

Meanwhile, Japanese Patent Application Laid-Open No. 2013-118320 discloses a technique in which a wafer holding portion and a conductive probe contact area are adjacently disposed on the upper surface of a wafer chuck (chuck stage), the probe contact area is electrically conducted to the wafer holding portion, and a front-surface electrode probe and a back-surface electrode probe are disposed so as to be spaced a distance apart from each other in the horizontal direction such that, when the front-surface electrode probe relatively moves in an inspection object wafer, the back-surface probe relatively moves in the probe contact area.

According to the technique disclosed in Japanese Patent Application Laid-Open No. 2013-118320, even if the wafer chuck is moved with respect to the front-surface electrode probe when individual chips on the wafer are sequentially inspected, it is not necessary to move the back-surface electrode probe. Therefore, it is assumed that not only an electrical path between the tester and the front-surface electrode probe but also an electrical path between the tester and the back-surface electrode probe can be maintained to have a constant shortest length at any time, and the wafer level inspection can be conducted at high accuracy.

SUMMARY OF THE INVENTION

By the way, in the wafer level inspection, inspection of a chip of the high-temperature state and inspection of a chip of the low-temperature state are often conducted according to an environment in which the chips are used. In this case, the heating and cooling of the chips are performed by a wafer chuck that holds a wafer on which the chips are formed. That is, the wafer chuck is designed such that the heating of the wafer chuck is conducted by a heater installed in the wafer chuck and the cooling of the wafer chuck is conducted by circulating a cooling liquid to a cooling liquid passage installed in the wafer chuck. The Peltier element and chiller utilizing the thermoelectric effect, and so on, may be used for the heating and cooling of the wafer chuck.

However, in a case where the wafer chuck is heated or cooled for the heating or cooling of a chip, in the technique disclosed in Japanese Patent Application Laid-Open No. 2013-118320, since the wafer chuck has a structure in which a wafer holding portion and a probe contact area are integrated, not only the wafer holding portion but also the probe contract area is heated or cooled and therefore the energy efficiency deteriorates. Moreover, the temperature change of the wafer holding portion is transferred to the probe contact area, and, by the influence of thermal expansion by this heat and the oxidation of the contact area or back-surface electrode probe by the heat, and so on, troubles such as a contact failure between the back-surface electrode probe and the probe contact area become likely to occur, and there are problems that the measurement accuracy of the wafer level inspection deteriorates and the durability degrades.

The present invention is made in view of such circumferences, and aims to provide a prober that can improve the measurement accuracy and reliability of wafer level inspection in high-frequency measurement and dynamic measurement without being subjected to the influence by a temperature change of a wafer chuck.

To achieve the above-mentioned object, a prober according to one aspect of the present invention includes: a wafer chuck which holds a wafer on which multiple chips having an electrode in each surface are formed and has a conductive support surface which can come into contact with a back-surface electrode of a chip; a movement rotation mechanism which moves and rotates the wafer chuck; a head stage which holds a probe holding portion having a probe that comes into contact with a front-surface electrode of the chip and connects the front-surface electrode with a terminal of a tester to electrically inspect the chip; a stage member which has a conductive stage surface that is formed in parallel to the support surface and electrically connected with the support surface, and can move integrally with the wafer chuck; and a contactor which is disposed in a position facing the stage member and whose tip can electrically come into contact with the stage surface, wherein: the stage member is separated from the wafer chuck as a separate body, and the stage surface and the support surface are electrically connected through a wiring member; and the back-surface electrode of the chip is electrically connected with the tester through the wafer chuck, the wiring member, the stage member and the contactor.

According to the present invention, since the stage member is separated from the wafer chuck as a separate body and the stage surface of the stage member and the support surface of the wafer chuck are electrically connected through the wiring member, the temperature change of the wafer chuck is less likely to be transferred to the stage member and the thermal deformation of the stage member is prevented. By this means, the contact position of the contactor with respect to the stage surface of the stage member does not vary and the contactor can always come into contact with the stage surface of the stage member with predetermined pressure. Therefore, it becomes possible to improve the measurement accuracy and reliability of wafer level inspection in high-frequency measurement and dynamic measurement without being subjected to the influence by a temperature change of the wafer chuck.

In a preferred mode of the present invention, the wafer chuck includes a heating and cooling mechanism which heats or cools the wafer held in the wafer chuck. According to this mode, the effect of the present invention becomes more remarkable.

Moreover, in a preferred mode of the present invention, the stage member is configured such that the contactor can always come into contact with the stage surface when the probe comes into contact with the front-surface electrode of the chip in a movable range of the wafer chuck. According to this mode, since the prober is configured such that the contactor can always come into contact with the stage surface of the stage member when the probe comes into contact with the front-surface electrode of the chip regardless of the position of the wafer chuck, it becomes possible to conduct the wafer level inspection stability and surely.

Moreover, in a preferred mode of the present invention, the contactor is formed with a spring pin or a contactor having a probe card-like shape. Thus, according to this mode, it is possible to form the contactor with the spring pin or the contactor of the probe card shape.

Moreover, in a preferred mode of the present invention, the contactor is fixed to the head stage or the probe holding portion. Thus, according to this mode, the position to which the contactor is fixed may be the head stage or the probe holding portion.

Moreover, in a preferred mode of the present invention, the contactor is disposed as contactor groups formed with multiple contactors which are adjacent to each other, and the contactor groups are disposed at predetermined intervals. According to this mode, it becomes possible to downsize the stage member.

According to the present invention, it is possible to improve the measurement accuracy and reliability of wafer level inspection in high-frequency measurement and dynamic measurement without being subjected to the influence by a temperature change of a wafer chuck.

BRIEF DESCRIPTION OF THE DRAWINGS

FIGS. 3A to 3E are diagrams illustrating a position change between the position of a chip to be inspected on a wafer and spring pins;

DETAILED DESCRIPTION OF THE PREFERRED EMBODIMENTS

In the following, preferred embodiments of the present invention are described according to the accompanying drawings.

Figure 1:
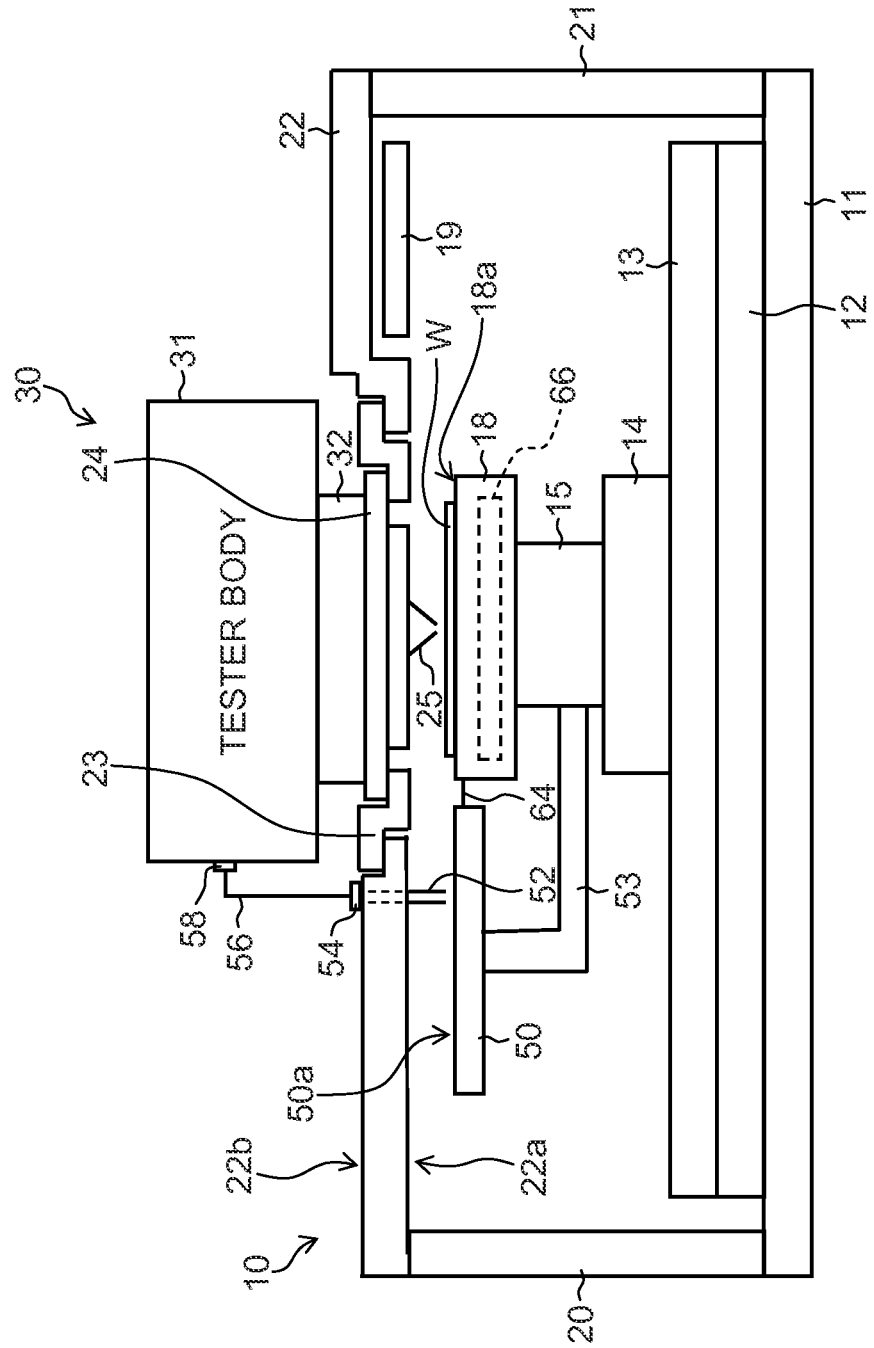
FIG. 1 is a diagram illustrating a schematic configuration of a wafer test system of an embodiment of the present invention.

FIG. 1 is a diagram illustrating the schematic configuration of a wafer test system of an embodiment of the present invention. As illustrated in the FIG. 1, the wafer test system includes a prober 10 that comes into contact with a probe to the electrode of each chip on a wafer, and a tester 30 that is electrically connected with the probe, applies current or voltage to each chip for electrical inspection and measures the characteristic.

The prober 10 has a base mount 11, a mobile base 12 provided above the base mount 11, a Y-axis moving platform 13, a X-axis moving platform 14, a Z-axis movement/rotation portion 15, a wafer chuck 18, a wafer alignment camera 19, props 20 and 21, a head stage 22, a card holder 23 installed in the head stage 22 and a probe card 24 to which the card holder 23 is attached. A probe 25 is installed in the probe card 24.

The mobile base 12, the Y-axis moving platform 13, the X-axis moving platform 14 and the Z-axis movement/rotation portion 15 form a movement/rotation mechanism that moves and rotates the wafer chuck 18 around the 3-axis directions and the Z axis. The movement/rotation mechanism is widely known and therefore explanation of that mechanism is omitted here.

The probe card 24 has the probe 25 disposed according to the electrode disposition of a device to be inspected, and is exchanged according to the device to be inspected. Here, a needle alignment camera that detects the position of the probe and a cleaning mechanism that cleans the probe, and so on, are installed, but they are omitted here.

The tester 30 has a tester body 31 and a contact ring 32 installed in the tester body 31. The terminal which is connected with each probe 25 is installed in the probe card 24, and the contact ring 32 has a spring probe disposed so as to contact this terminal. The tester body 31 is held in the prober 10 by an unillustrated support mechanism.

The wafer chuck 18 has a conductive support surface (wafer placement surface) 18a that holds the back surface of the wafer W in a state coming into contact with that back surface and operates as a measurement electrode of the tester 30.

A heating and cooling mechanism 66 (heating and cooling mechanism) as a heating/cooling source is installed in the wafer chuck 18 such that it is possible to conduct an electrical characteristic inspection of a chip at a high-temperature state, for example, 150° C. at maximum, or at a low-temperature state, for example, −40° C. at minimum. As the heating and cooling mechanism 66, it is possible to adopt a known arbitrary heater/cooler, for example, various ones may be considered such as a heating/cooling apparatus having a double-layer structure of a heating layer of a surface heater and a cooling layer in which a cooling fluid path is installed; and a heating/cooling apparatus having a single-layer structure in which a cooling tube that wraps a heating heater in a thermal conductor is laid. Moreover, a heating/cooling apparatus in which, instead of electrical heating, a thermal fluid is circulated or a heating/cooling apparatus using the Peltier element may be used.

In the present embodiment, in addition to the above-mentioned configuration, it is configured to include a stage member 50 disposed in the position adjacent to the wafer chuck 18 and multiple spring pins 52 fixed to the head stage 22 in the position facing the stage member 50.

The stage member 50 has a disc-like structure formed separately from the wafer chuck 18 as a separate body, and is installed in the position separated from the wafer chuck 18. The stage member 50 is formed with a material of a small thermal expansion coefficient and has a configuration in which thermal deformation of the stage member 50 is prevented.

Figure 2:
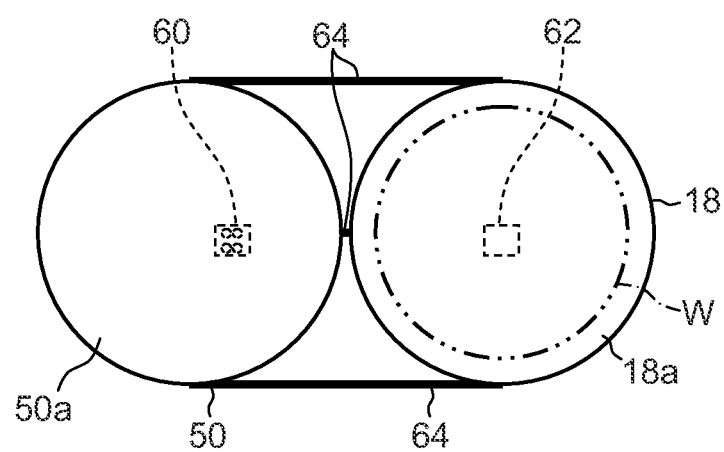
FIG. 2 is a plan view illustrating a relationship between a wafer chuck and a stage member.

The stage member 50A includes a conductive stage surface 50a with which each spring pins 52 can be brought into contact. As illustrated in FIG. 2, this stage surface 50a has a planar shape (circular shape) similar to the support surface 18a of the wafer chuck 18, and these planar shapes are formed to have areas (plane areas) equal to each other. Here, the stage surface 50a may be formed to have a shape other than a circular shape having a larger area (plane area) than the support surface 18a of the wafer chuck 18.

Multiple wirings 64 (wiring members) are installed between the stage member 50 and the wafer chuck 18. In this example, three wirings 64 are installed. One end of each wiring 64 is electrically connected with the stage surface 50a of the stage member 50, and the other end of each wiring 64 is electrically connected with the support surface 18a of the wafer chuck 18. That is, electrical conduction is secured between the stage surface 50a of the stage member 50 and the support surface 18a of the wafer chuck 18 by the multiple wirings 64.

Returning to FIG. 1, the stage surface 50a of the stage member 50 is installed so as to be parallel to and flush with the support surface 18a of the wafer chuck 18. Here, if the spring pins 52 can always come into contact with the stage surface 50a when the probe 25 comes into contact with the chip front-surface electrode of the wafer W, the stage surface 50a is not required to be installed so as to be flush to the support surface 18a.

In a surface (lower surface in FIG. 2) on the opposite side to the stage surface 50a of the stage member 50, one end of an L-shaped coupling member 53 is coupled and fixed. The other end of the coupling member 53 is coupled and fixed to the side part of the Z-axis movement/rotation portion 15. Therefore, the stage member 50 can move integrally with the wafer chuck 18, and, when the wafer chuck 18 moves in a predetermined direction, the stage member 50 also moves in the same direction with the wafer chuck 18.

Here, in the present embodiment, a mode is preferable where the stage member 50 is fixed to the bottom side (lower side in FIG. 1) of the side part of the Z-axis movement/rotation portion 15 through the L-shaped coupling member 53. According to this mode, as compared with a case where the wafer chuck 18 and the stage member 50 are integrally formed, since it is possible to effectively prevent the inclination of the wafer chuck 18 even if the spring pins 52 described later are brought into contact with the stage surface 50a of the stage member 50, it is possible to stably bring the electrode of a chip into contact with the probe 25 regardless of the position of the chip to be inspected on the wafer W.

In the lower surface (surface facing the stage member 50) 22a of the head stage 22, multiple spring pins 52 that can be brought into contact with the stage surface 50a of the stage member 50 are installed in a state where the spring pins are close to each other. In this example, four spring pins 52 are installed. Each spring pin 52 is formed with a conductive thin needle having a spring character by itself and are configured such that, when the wafer chuck 18 rises and the probe 25 comes into contact with the chip front-surface electrode of the wafer W, each spring pin 52 comes into contact with the stage surface 50a of the stage member 50 with a predetermined contact pressure. Here, in FIG. 2, reference numeral 60 designates the contact position in the stage surface 50a on the stage member 50 with which the spring pins 52 are brought into contact. Moreover, reference numeral 62 designates the position of a chip with which the probe 25 is brought into contact on the wafer W.

A connector portion 54 that is commonly connected to each spring pin 52 is installed in an upper surface 22b of the head stage 22. On end of a cable 56 is connected with the connector portion 54 and the other end of the cable 56 is connected with a connector portion 58 of the tester body 31. By this means, the chip back-surface electrode formed on the back surface of the wafer W is electrically connected with the tester body 31 through the wafer chuck 18, the wiring 64, the stage member 50, the spring pins 52, the connector portion 54, the cable 56 and the connector portion 58.

Next, wafer level inspection by a wafer test system of the present embodiment is described.

First, wafer W to be inspected is loaded on the wafer chuck 18 by an unillustrated wafer load mechanism, and the wafer chuck 18 is caused to hold wafer W.

Next, the position (tip position) of the tip of the probe 25 is detected by an unillustrated needle alignment camera. Subsequently, the wafer chuck 18 is moved such that wafer W locates below the wafer alignment camera 19 in a state where wafer W is held in the wafer chuck 18, and the position of an electrode (chip front-surface electrode) of a chip on the wafer W is detected. The positions of all electrodes of one chip need not be detected, and it only has to detect the positions of some of the electrodes. Moreover, the electrodes of all chips on the wafer W need not be detected, and the positions of electrodes of some of the chips are detected.

After the position of the probe 25 and the position of the electrode of a chip on the wafer W are detected, the wafer chuck 18 is rotated by the Z-axis movement/rotation portion 15 such that the arrangement direction of the electrode of the chip matches the arrangement direction of the probe 25. Further, the wafer chuck 18 is moved so that the electrode of the chip to be inspected on the wafer W is located below the probe 25, and then, the wafer chuck 18 is raised and the electrode of the chip is brought into contact with the probe 25. At this time, the stage member 50 disposed so as to be adjacent to the wafer chuck 18 also rises in an integrated manner, and each spring pin 52 comes into contact with the stage surface 50a of the stage member 50. By this means, a chip back-surface electrode formed on the back surface of the wafer W is electrically connected with the tester body 31 through the wafer chuck 18, the wiring 64, the stage member 50 and the spring pins 52. Further, current and voltage are applied from the tester body 31 to the chip and the characteristic is measured.

When the inspection of this chip ends, the wafer W and the probe 25 are separated once, the wafer chuck 18 is moved so as to locate another chip below the probe 25, and similar operation is performed. Thereafter, each chip is sequentially selected and inspected. Further, when the inspection of all specified chips on the wafer ends, the inspection of one wafer ends.

Thus, the inspection of the wafer W ends when the inspection of all chips on the wafer W ends, the wafer W having been inspected is unloaded, a wafer W to be inspected next is loaded and the above-mentioned operation is performed.

Next, the effect of the present embodiment is described.

FIGS. 3A to 3E are diagrams illustrating a relative positional relationship between the position of a chip to be inspected on the wafer W and the spring pins 52. FIGS. 3A to 3E illustrate cases where chips in the center, left end, right end, upper end and lower end on the wafer W are inspected, respectively.

As illustrated in FIGS. 3A to 3E, the wafer chuck 18 moves such that the electrode (chip front-surface electrode) of a chip to be inspected on the wafer W locates below the probe 25 as mentioned above. Meanwhile, since the spring pins 52 are fixed to the head stage 22, the relative positional relationship between the probe 25 and the spring pins 52 does not change even if the wafer chuck 18 moves. Therefore, even if position 62 of the chip to be inspected on the wafer W changes, distance L from that position 62 to the position 60 where the spring pins 52 come into contact with the stage surface 50a on the stage member 50 is always constant.

Therefore, according to the present embodiment, since the length of an electrical path connected from a chip back-surface electrode to the tester body 31 through the wafer chuck 18, the wiring 64, the stage member 50 and the spring pins 52 always becomes constant regardless of the position of a chip to be inspected on the wafer W, it is possible to stably perform high-frequency measurement and dynamic measurement without being influenced by resistance and impedance in the electrical path, and it becomes possible to perform wafer level inspection at high accuracy.

Moreover, according to the present embodiment, the stage member 50 is separated from the wafer chuck 18 as a separate body, and, since the stage surface 50a of the stage member 50 and the support surface 18a of the wafer chuck 18 are electrically connected through the multiple wirings 64, the stage member 50 is thermally separated from the wafer chuck 18. Therefore, even in a case where the wafer chuck 18 is heated or cooled at the time of wafer level inspection, since the temperature change of the wafer chuck 18 is less likely to be transferred to the stage member 50 and a heat insulation effect can be acquired, the energy efficiency is good and the thermal deformation of the stage member 50 is prevented. By this means, the spring pins 52 can always come into contact with the stage surface 50a of the stage member 50 with predetermined pressure without changes in the contact position (position in the Z axis direction) with respect to the stage surface 50a of the stage member 50 of the spring pins 52. Therefore, it becomes possible to improve the measurement accuracy and reliability of wafer level inspection without being influenced by the temperature change of the wafer chuck 18.

Moreover, according to the present embodiment, since the wafer chuck 18 and the stage member 50 are separately formed as separate bodies, regarding the wafer chuck 18, it becomes possible to reuse the conventional one, and it is possible to attain the shortening of design time and manufacturing process, the reduction of design labor and the reduction of costs, and so on.

The embodiment of the present invention has been described above, but the present invention is not limited to the above-mentioned example, and it should be understood that various improvements and changes can be performed without departing from the scope of the present invention. In the following, some variation examples are described.

Variation Example 1

In the above-mentioned embodiment, the stage member 50 is configured so as to be fixed to a position adjacent to the wafer chuck 18, but the stage member 50 may be configured so as to be foldable.

Figure 4:
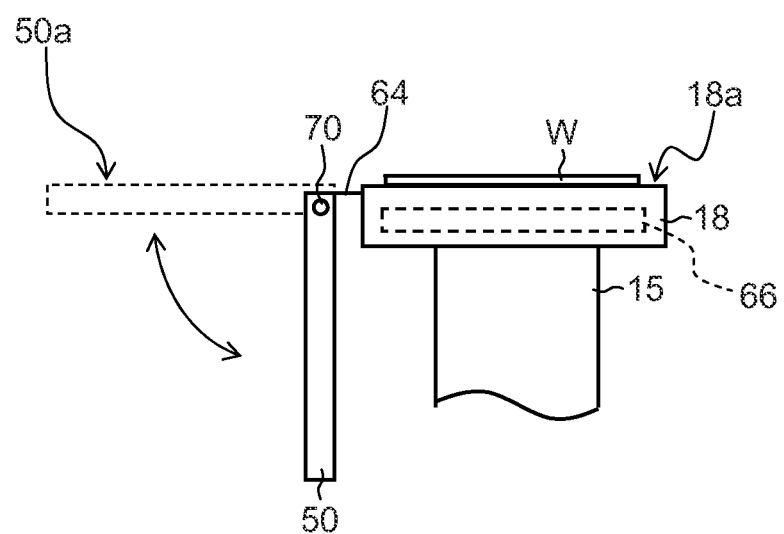
FIG. 4 is an explanatory diagram of a first variation example.

For example, in the variation example illustrated in FIG. 4, the stage member 50 is configured so as to be rotatable around a rotation axis 70 installed in the edge part (edge part on the wafer chuck) of the stage member 50. That is, the stage member 50 is configured so as to be rotatable around the Y axis (the direction vertical to the surface of FIG. 4), and can transition between a state where the stage surface 50a is disposed to be parallel to the support surface 18a of the wafer chuck 18 (shown by the dotted line in FIG. 4) and a state where it is disposed to be vertical to it (shown by the solid line in FIG. 4).

According to a mode in which the stage member 50 is configured so as to be foldable in this way, at the time of load or unload and alignment of the wafer W, it is possible to expand an operable range of the wafer chuck 18 by moving the wafer chuck 18 in a state where the stage member 50 is folded (which is illustrated by the solid line in FIG. 4). Moreover, it also becomes possible to mount a larger wafer chuck 18, and it becomes possible to conduct wafer level inspection even for a wafer W of a large diameter.

Variation Example 2

Figure 5:
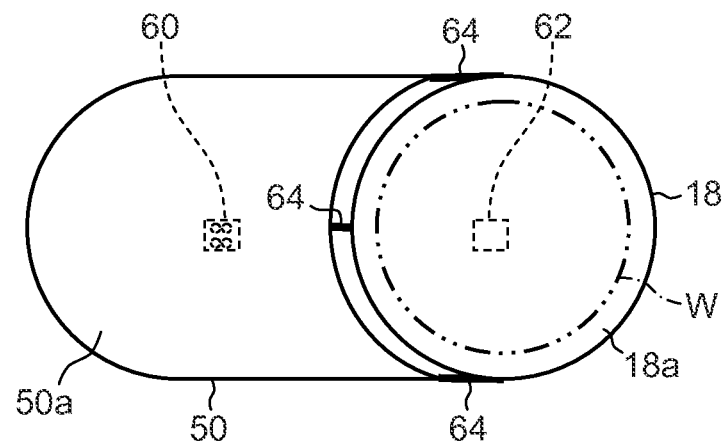
FIG. 5 is an explanatory diagram of a second variation example.

In the above-mentioned embodiment, as illustrated in FIG. 2, the stage surface 50a of the stage member 50 has the same shape and area as the support surface 18a of the wafer chuck 18, but the stage surface 50a may have a different shape or an area as long as the spring pins 52 can always come into contact with the stage surface 50a in at least a movable range of the wafer chuck 18. For example, a mode is possible in which the stage surface 50a of the stage member 50 has the same planar shape (circular shape) as the support surface 18a of the wafer chuck 18 and has a larger area than the support surface 18a. Moreover, as illustrated in FIG. 5, a mode is possible where the side surface of the stage member 50 on the side of the wafer chuck 18 is formed in a concave shape along the side surface of the wafer chuck 18. In any modes, the spring pins 52 always come into contact with the stage surface 50a in at least a movable range of the wafer chuck 18, and it is possible to acquire an effect similar to the above-mentioned embodiment.

Variation Example 3

Figure 6:
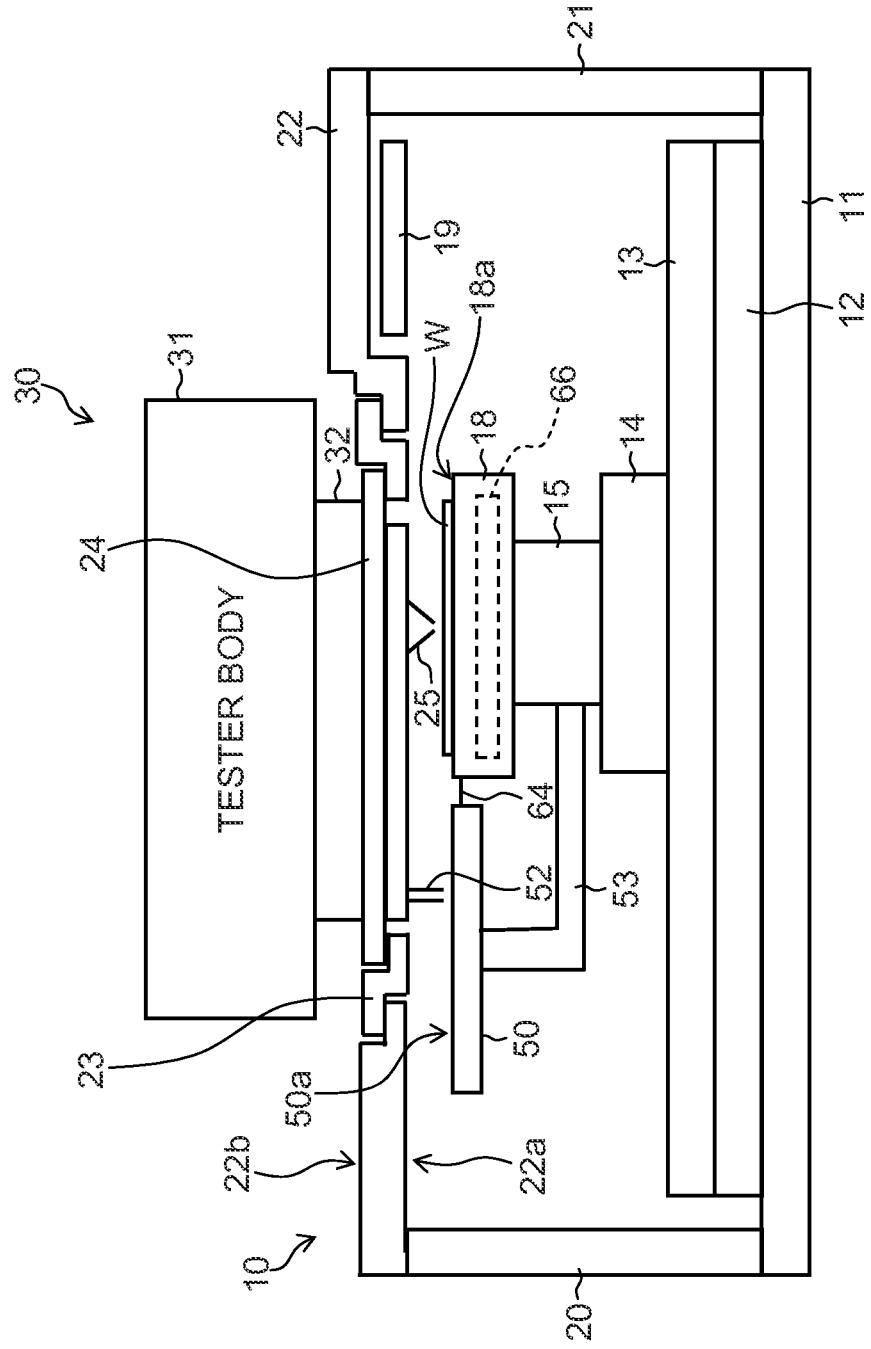
FIG. 6 is an explanatory diagram of a third variation example.

In the above-mentioned embodiment, a configuration is shown in which the spring pins 52 are installed in the head stage 22 forming the chassis of the prober 10, but the spring pins 52 may be installed in a member held in the head stage 22, and, for example, as illustrated in FIG. 6, it is possible to adopt a configuration in which the spring pins 52 are installed in the probe card 24. In this case, the spring pins 52 are electrically connected with the tester body 31 through the contact ring 32. By this means, since the relative positional relationship between the spring pins 52 and the probe 25 does not change even if the wafer chuck 18 moves, it is possible to acquire an effect similar to the above-mentioned embodiment.

Variation Example 4

In the above-mentioned embodiment, the spring pins 52 are preferably used as a contactors (conductive pins) that can come into contact with the stage surface 50a of the stage member 50, but it is also possible to use a contactor formed into a probe card-like shape such as a cantilever type and a vertical needle type, and so on.

Variation Example 5

Figure 7:
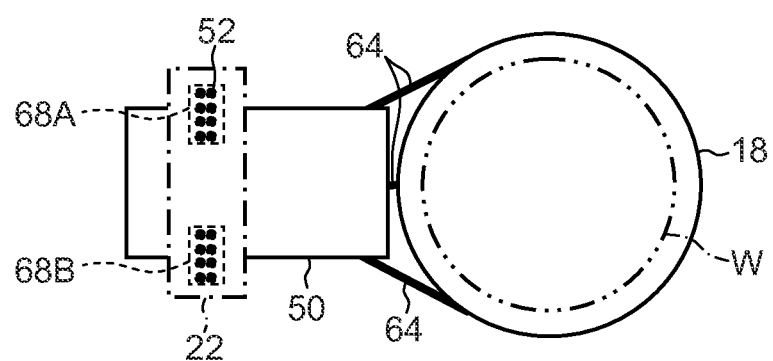
FIG. 7 is an explanatory diagram of a fifth variation example.

In the above-mentioned embodiment, a configuration is shown in which a contactor group formed with multiple spring pins 52 is installed in one place in the head stage 22 in a state where the spring pins 52 are closely arranged to each other, but a configuration is also possible in which the contactor group is installed in multiple places at predetermined intervals. For example, in the example illustrated in FIG. 7, two installation positions 68A and 68B are installed at a predetermined interval in the head stage 22 (only a part of the head stage 22 is illustrated), and a contactor group formed with eight spring pins 52 is disposed in each of the installation positions 68A and 68B, respectively. Like this, according to a configuration in which the contactor groups are installed in multiple places, it is possible to downsize the stage member 50 as compared with a configuration in which the contactor group is installed in one place.

Variation Example 6

In the above-mentioned embodiment, a configuration including the probe card 24 is shown, but a configuration including a probe head form which has no probe card 24 may be applicable. That is, a probe holding portion held in the head stage 22 is not limited to the probe card 24 and may be a probe head of a manipulator type, and so on.

What is claimed is:

1. A prober comprising:
a wafer chuck which holds a wafer on which multiple chips having an electrode in each surface are formed and has a conductive support surface which can come into contact with a back-surface electrode of a chip;
a movement rotation mechanism which moves and rotates the wafer chuck;
a head stage which holds a probe holding portion having a probe that comes into contact with a front-surface electrode of the chip and connects the front-surface electrode with a terminal of a tester to electrically inspect the chip;
a stage member which has a conductive stage surface that is formed in parallel to the support surface and electrically connected with the support surface, and can move integrally with the wafer chuck; and
a contactor which is disposed in a position facing the stage member and whose tip can electrically come into contact with the stage surface, wherein:
the stage member is separated from the wafer chuck as a separate body, and the stage surface and the support surface are electrically connected through a wiring member; and
the back-surface electrode of the chip is electrically connected with the tester through the wafer chuck, the wiring member, the stage member and the contactor.

2. The prober according to claim 1, wherein the wafer chuck includes a heating and cooling mechanism which heats or cools the wafer held in the wafer chuck.

3. The prober according to claim 1, wherein the stage member is configured such that the contactor can always come into contact with the stage surface when the probe comes into contact with the front-surface electrode of the chip in a movable range of the wafer chuck.

4. The prober according to claim 1, wherein the contactor is formed with a spring pin.

5. The prober according to claim 1, wherein the contactor is formed with a contactor having a probe card-like shape.

6. The prober according to claim 1, wherein the contactor is fixed to the head stage.

7. The prober according to claim 1, wherein the contactor is fixed to the probe holding portion.

8. The prober according to claim 1, wherein the contactor is disposed as contactor groups formed with multiple contactors which are adjacent to each other, and the contactor groups are disposed at predetermined intervals.

* * * * *